United States Patent [19]

Mohr et al.

[11] Patent Number: 4,786,381

[45] Date of Patent: Nov. 22, 1988

[54] PROCESS FOR ELECTROCHEMICALLY MODIFYING SUPPORT MATERIALS OF ALUMINUM OR ALUMINUM ALLOYS, WHICH HAVE BEEN GRAINED IN A MULTI-STAGE PROCESS AND USE OF THESE MATERIALS IN THE MANUFACTURE OF OFFSET-PRINTING PLATES

[75] Inventors: Dieter Mohr, Schlangenbad; Engelbert Pliefke, Wiesbaden, both of Fed. Rep. of Germany

[73] Assignee: Hoechst Aktiengesellschaft, Frankfurt am Main, Fed. Rep. of Germany

[21] Appl. No.: 106,646

[22] Filed: Oct. 13, 1987

[30] Foreign Application Priority Data

Oct. 17, 1986 [DE] Fed. Rep. of Germany ....... 3635303

[51] Int. Cl.$^4$ ................................................ C25F 3/04
[52] U.S. Cl. ................................................ 204/129.75
[58] Field of Search .................... 204/129.75, 129.8

[56] References Cited

U.S. PATENT DOCUMENTS

| | | |
|---|---|---|
| 2,344,510 | 3/1944 | Hagelin ........................ 101/149.2 |
| 3,865,700 | 11/1975 | Fromson ........................... 204/28 |
| 3,929,591 | 12/1975 | Chu et al. ........................ 204/17 |
| 3,935,080 | 1/1976 | Gumbinner et al. ................ 204/28 |
| 4,476,006 | 10/1984 | Ohba et al. ....................... 204/17 |
| 4,477,317 | 10/1984 | Chu et al. ........................ 204/33 |
| 4,482,444 | 11/1984 | Frass et al. .................. 204/129.35 |

FOREIGN PATENT DOCUMENTS

| | | |
|---|---|---|
| 0131926 | 1/1985 | European Pat. Off. . |
| 53-123204 | 10/1978 | Japan . |
| 53-145701 | 12/1978 | Japan . |
| 57-16918 | 4/1982 | Japan . |
| 58-197090 | 11/1983 | Japan . |
| 81/1545 | 3/1982 | South Africa . |
| 1532303 | 11/1978 | United Kingdom . |
| 1532304 | 11/1978 | United Kingdom . |
| 2058136 | 4/1981 | United Kingdom . |
| 2060923 | 5/1981 | United Kingdom . |
| 2047274 | 11/1989 | United Kingdom . |

Primary Examiner—T. M. Tufariello
Attorney, Agent, or Firm—Foley & Lardner, Schwartz, Jeffery, Schwaab, Mack, Blumenthal & Evans

[57] ABSTRACT

A process for electrochemically modifying support materials of aluminum or aluminum alloys, which have been grained in a multi-stage process is disclosed. These support materials can be used in the production of offset printing plates. The support material is mechanically grained in a stage I, subjected to an intermediate treatment in a stage II, electrochemically grained in a stage III, subjected to an intermediate treatment in a stage IV and anodically oxidized in a stage V. The intermediate treatment in stages II and/or IV are carried out by an electrochemical process using a direct current. The anodizing stage may be followed by a hydrophilizing stage VI.

24 Claims, No Drawings

PROCESS FOR ELECTROCHEMICALLY MODIFYING SUPPORT MATERIALS OF ALUMINUM OR ALUMINUM ALLOYS, WHICH HAVE BEEN GRAINED IN A MULTI-STAGE PROCESS AND USE OF THESE MATERIALS IN THE MANUFACTURE OF OFFSET-PRINTING PLATES

BACKGROUND OF THE INVENTION

The present invention relates to a process for electrochemically modifying aluminum or aluminum-alloy-based support materials for printing plates, which have been grained in a multi-stage process, after the first mechanical and/or the second electrochemical graining stage, and to the use of the materials thus modified in the manufacture of offset-printing plates.

Support materials for offset-printing plates are provided, on one or both sides, with a radiation-sensitive (light-sensitive) layer (copying or reproduction layer), either directly by the user or by the manufacturer of precoated printing plates, this layer permitting the production of a printing image (printing form) by a photomechanical process. Following the production of the printing form, the layer support carries the printing image-areas and, simultaneously, forms, in the areas which are free from an image (non-image areas), the hydrophilic image-background for the lithographic printing operation.

The following requirements must, among others, be met by a support for a radiation-sensitive material of this type used in the manufacture of lithographic plates:

Those portions of the radiation-sensitive layer which are comparatively more soluble following irradiation must be capable of being easily removed from the support, by a developing operation, in order to produce the hydrophilic non-image areas without leaving a residue.

The support, which has been laid bare in the non-image areas, must possess a high affinity for water, i.e., it must be strongly hydrophilic, in order to accept water, rapidly and permanently, during the lithographic printing operation, and to exert an adequate repelling effect with respect to the greasy printing ink.

The photosensitive layer must exhibit an adequate degree of adhesion prior to exposure, and those portions of the layer which print must exhibit adequate adhesion following exposure.

The support material should possess a good mechanical stability, for example, against abrasion and a good chemical resistance, particularly with respect to alkaline media.

Water requirements during printing should be as low as possible, for example, to prevent excessive moistening of the paper because, otherwise, "register difficulties" in color printing (i.e., the second or third color shade can no longer be printed in register upon the first color shade) or breaks in the paper web in rotary offset printing may occur.

In order to meet some of these requirements, support materials of aluminum, which are conventionally employed in practice, are first subjected to a mechanical, chemical and/or electrochemical graining treatment, which additionally may be followed by an anodic oxidation of the grained aluminum surface. Particularly electrochemically grained aluminum surfaces with their very fine-grained structure forming an interface between the support material and the radiation-sensitive layer of printing plates, produce, in the printing forms which can be manufactured from these plates, results which meet practical requirements and which already comply with most of the demands. Water requirements during printing are, however, often still too high in the support materials which have been grained and optionally anodically oxidized according to known processes. Modifications of these processes have, therefore, already been described which especially may be applied after the graining stage.

German Offenlegungsschrift No. 30 09 103 (equivalent to South African Pat. No. 81/1545) discloses an abrasive modification of electrochemically grained support materials for printing plates comprising aluminum. In this modifying treatment removal of material from the surface in the order of from 0.4 to 3.0 $g/m^2$ is effected under the action of an aqueous-alkaline solution which has a pH exceeding 11. Printing plates manufactured from support materials which have been thus modified and optionally anodically oxidized, are stated to have a lower consumption of dampening solution and a reduced adsorptivity.

In the method of producing printing plate support materials of aluminum according to German Offenlegungsschrift No. 25 57 222 (similar in content to U.S. Pat. No. 3,935,080), the support material is additionally cathodically modified (cleaned) in an aqueous sulfuric acid, between the stage of electrochemical graining in an aqueous hydrochloric acid and the stage of anodic oxidation in an aqueous sulfuric acid. It is stated that the method is, in the first place, suitable for use in a continuous process and that it results in a very clean surface.

From the prior art, a cathodic treatment is also known for use in other methods. For example, according to German Auslegeschrift No. 24 20 704 (equivalent to U.S. Pat. No. 3,865,700) cathodic contacting of aluminum supports is used in the anodic oxidation of these supports in an aqueous sulfuric acid, in order to prevent the use of contact rolls, which are normally present. German Pat. No. 25 37 724 (equivalent to British Pat. No. 1,532,303) discloses a one-stage graining process without subsequent abrasive modification of the surface, in which aluminum support-materials for printing plates are electrochemically treated in agitated aqueous salt solutions having a salt concentration of at least 200 g/l a pH ranging from 5 to 8 and a temperature of less than 60° C. The salts used are alkali metal salts, alkaline earth metal salts or ammonium salts of hydrohalogenic acids or oxo-acids of nitrogen or of halogens. In a process variant (resulting in surfaces of type A), the aluminum can be grained, in a cathodic circuit arrangement, for a period of from 30 to 60 seconds with direct current of 70 to 150 $A/dm^2$, whereby a silvery surface with a dull finish is produced; in this variant, alkali metal salts are exclusively used. Similarly, German Pat. No. 25 37 725 (equivalent to British Pat. No. 1,532,304) describes a possible cathodic circuit arrangement for the graining of aluminum, in which the aqueous electrolyte, at a pH ranging from 1 to 5, must contain an alkali metal salt in addition to aluminum salts.

The use of multi-stage processes for the purpose of graining support materials for lithographic printing plates is disclosed, for example, in U.S. Pat. Nos. 2,344,510; 3,929,591 and 4,477,317 (equivalent to British Pat. No. 1,582,620), in Japanese Patent applications Nos. 123,204/78; 145,701/78; 16,918/82 and 197,090/83, in German Offenlegungsschriften Nos. 30 12 135 (equivalent to U.S. Pat. No. 4,476,006 or British patent application No. 2,047,274), 30 31 764 (equivalent to British patent application No. 2,058,136) and 30 36 174 (equivalent to British patent application No. 2,060,923) and in European patent application No. 0,131,926. Nearly all these processes specify that it is necessary to perform a cleaning treatment between mechanical and electrochemical graining. If this treatment is carried out in an acid medium, only a slight attack on the mechanically produced graining structure is to be expected. The cleaning action is predominant. Contrary to this, an alkaline treatment results in a definite modification of the surface.

A chemical intermediate treatment following the electrochemical, second graining stage and preceding anodization is mentioned in U.S. Pat. No. 2,344,510 and is described in Japanese patent application No. 123,204/78, German Offenlegungsschrift No. 30 12 135 (equivalent to British Pat. No. 2,047,274 or U.S. Pat. No. 4,476,006) and German Offenlegungsschrit No. 30 36 174 (equivalent to British patent application No. 2,060,923). This treatment is carried out either under acidic or alkaline conditions and the above-mentioned effects are attained. Particularly in an alkaline treatment the electrochemical graining structure is, to a large extent, levelled by the removal of thin pore walls, which may have positive effects on the water/ink balance, but entails shorter print runs of the printing plate so produced.

A cathodic surface modification which is carried out after a one-stage electrochemical graining treatment is disclosed in German Offenlegungsschrift No. 32 22 967 (equivalent to U.S. Pat. No. 4,482,444). This treatment obviates the disadvantages of an acidic or alkaline pickling treatment, which are described in this application and leads to support materials with improved water/ink ink balance and reduced abrasion during printing, without adversely influencing the adherence of the photosensitive layer.

SUMMARY OF THE INVENTION

It is an object of the present invention to provide a process for the manufacture of support materials for printing plates which improves the uniformity of the surface produced in a preceding graining treatment.

It is a further object of the invention to provide a process for the manufacture of support materials for printing plates which reduces the amount of dampening solution required in the printing process.

It is another object of the invention to provide a process for the manufacture of support materials for printing plates having increased abrasion resistance.

It is another object of the invention to provide a process for the manufacture of support materials for printing plates having a more exact exposure control and improved resolution.

These and other objects are achieved by a process for the manufacture of grained support materials of aluminum or an aluminum alloy for use in offset printing plates, which comprises the following treatment stages:
(I) mechanical graining of the material,
(II) intermediate treatment,
(III) electrochemical graining in an acid-containing electrolyte,
(IV) intermediate treatment, and
(V) anodic oxidation of the surface.

In the process of the invention the intermediate treatment in stages II and/or IV is an electrochemical treatment, in which the grained sheet of the preceding stage is made the cathode and an electrochemical removal of material on the order of from about 0.1 to 10 g/m$^2$ is effected in an aqueous electrolyte having a pH from 0 to 11. The aqueous electrolyte contains at least one water-soluble salt in a concentration from about 3 g/l up to the saturation limit and/or an acid in a concentration from about 0.5 to 50 g/l. A direct current from about 3 to 100 A/dm$^2$ is applied at a temperature from about 15° to 90° C. for about 5 to 90 seconds.

As a result of the cathodic treatment of the present invention, carried out after mechanical graining, the electrochemical attack in the following stage is unexpectly rendered more uniform. This improvement of uniformity becomes apparent when using alternating current, but is even more apparent when using direct current.

When applied after the electrochemical, second graining stage, the cathodic modification of the invention effects a reduction of the demand for water in the printing process, without losses in print run stability being observed in the case of layers of different chemical origin. In a preferred embodiment of the present invention, the cathodic surface modification of the invention is therefore carried out after the mechanical graining stage and also after the electrochemical graining stage.

The process can also be conducted in such a way that in one of stages II and IV a purely acidic or alkaline intermediate treatment is performed, this kind of treatment being preferably used in stage II.

DESCRIPTION OF THE PREFERRED EMBODIMENTS

In preferred embodiments, the electrolyte has a pH from 3 to 9 and contains at least one water-soluble salt in a concentration from about 10 to 250 g/l. The process conditions are appropriately chosen in such a way that the electrochemical modification is carried out using direct current at a current density from about 3 to 100 A/dm$^2$, particularly from about 10 to 80 A/dm$^2$, at a temperature from about 15° to 90° C., particularly from about 20° to 40° C. and for a duration from about 5 to 90 seconds, particularly from about 10 to 60 seconds; the corresponding voltage ranges from about 5 to 60 V, particularly from about 10 to 40V.

In the application of the cathodic modification according to the invention in stage II, the preferred value for the electrochemical removal of material, which is readily and without difficulty controlled via the voltage or current density applied, depends on the type of graining produced in stage I. If mechanical graining in stage I is effected by texturing with wire brushes, the values for the electrochemical removal of material in stage II are advantageously in the range between about 1 and 10 g/m$^2$. In the case of low values of up to about 3 g/m$^2$, the surface texture obtained after the subsequent electrochemical graining is rather similar to the type described in German Offenlegungsschrift No. 33 05 067 (equivalent to South African Pat. No. 84/0821), whereas in the case of higher values in stage II, a more pronounced wave-structure is produced, on which a fine electrochemical graining can, uniformly and without any local preferences, be generated in stage III.

For an aluminum sheet which has been pretextured by slurry brushing in stage I, adjustment to values for the electrochemical removal of material ranging between about 0.5 and 3 g/m$^2$ in stage II is sufficient to ensure a uniform current attack in stage III.

In the case of mechanical graining by means of sandblasting in stage I, high values for the electrochemical removal of material in stage II, which are in the range between about 6 and 10 g/m², have a favorable influence on the water/ink balance of the support material so prepared.

When the cathodic intermediate treatment according to the invention is used in stage IV, values for the electrochemical removal of material between about 0.1 and 0.5 g/m² may lead to certain improvements of the surface, but their effect is generally insufficient. Values in excess of about 5 g/m² possibly may be too high, particularly when the preceding graining treatment was rather shallow, i.e., gave relatively low peak-to-valley heights. The process may be performed discontinuously; however, it is preferred that it be conducted continuously in a modern web processing installation.

For the aqueous electrolyte used in the cathodic modification process of the invention, any water-soluble salts, which increase the conductivity of water to a sufficient degree and have cations which, under the conditions employed, do not interact with the aluminum which is made the cathode in such a way that the redox products are deposited thereupon, are suitable in principle. In order to obtain a conductivity which is suitable for practical purposes, it is preferable to use alkali metal salts, alkaline earth metal salts or aluminum salts of halohydric acids, and also of the oxo-acids of halogens, carbon, boron, nitrogen, phosphorus, and sulfur or of the fluorine-containing acids of boron, silicon, phosphorus, and sulfur, either alone or combined with one another. Included are, in particular, the Na, K or Mg salts of hydrochloric acid, chloric acid, nitric acid, sulfuric acid, phosphoric acid, fluoboric acid or fluosilicic acid, particularly preferably the chlorides or nitrates. As the electrolyte, the aqueous solutions of the above-specified salts are preferably used. To achieve special effects the electrolyte solutions may also contain the acids corresponding to the salts or mixtures of the acids and salts specified.

From the point of view of production engineering, economy and ecology, the salts used in the electrolyte preferably include those which effect a good conductivity at low concentrations and the aqueous solutions of which already have a pH close to the neutral point.

It is believed that in the process of the invention, the walls of the pores (cells) which have been generated in the preceding electrochemical graining are partially removed in stage IV and micropores are formed at the bottom of the cells; by influencing the topography in this manner, a less rugged surface is presumably produced. The structure of the surface is clearly distinguishable from a structure resulting from a one stage graining treatment in an aqueous electrolyte which has a pH within the neutral range.

It is possible that the process of cathodically modifying aluminum surfaces, which have already been electrochemically grained is, in the first place, determined by the electrical conditions used (current density or voltage) in connection with the duration of treatment (quantity of charge passed). Based on this assumption, any other adjustable process parameters, such as, for example, temperature, type of salt or electrolyte concentration, have only an indirect effect through the influence exerted on the electrical conductivity.

Compared with other processes for the manufacture of support materials for lithographic printing plates, which have hitherto become known, the process of the invention for cathodically modifying aluminum surfaces, as used in any one of stages II and IV, results in many advantages, both in terms of process engineering and application technology.

From the the point of view of process engineering, by employing the process of the invention in stage II, the primary coarse structure—produced by wire-brushing, slurry-brushing, sandblasting or other mechanical texturing methods—can be matched in a plurality of minute variations to the subsequent process stages and to the final properties for application. A fine gradation of this kind cannot be obtained in the hitherto known methods for the chemical intermediate treatment. This fine gradation of attack is similarly advantageous in stage IV of the process. Moreover, stages II and IV have a particularly advantageous effect when combined with an anodic direct current process in stage III.

Further process advantages stem from the highest possible degree of neutrality of the electrolyte (with respect to its pH value). The uncontrollable, purely chemical attack on the aluminum is presumably negligible so that the modifying electrochemical removal of material can be controlled, within wide temperature ranges, essentially through the electrical parameters and the treatment time. It is thus possible to modify support materials for various fields of application, with a view to particular results and without great expenditure. Finally, because the salt used in the aqueous electrolyte is essentially only required to increase the conductivity of water and is not consumed in the treatment, the bath can be employed for a very long time, without any "topping-up" or purifying operations, i.e., it has a long useful life.

From the point of view of application technology, the lighter support surface yields an improved contrast between image and non-image areas after development. Furthermore, the roughened structure has increased uniformity without major cavities, resulting in a more exact control of exposure and an improved resolution of the radiation-sensitive coatings on the printing plates. The shallower surface roughness leads to a reduced consumption of dampening solution during printing and to an increased abrasion resistance of the surface. Finally, the surface of the support material can be adapted to the requirements of various fields of application in printing, without any need for major changes in the process.

As the metal substrate for the material in the form of a web, a foil or a sheet, aluminum or an aluminum alloy is used. Preference is given to the following materials:

"Pure aluminum" (DIN Material No. 3.0255), i.e., composed of not less than 99.5% of Al, and the following permissible admixtures (maximum total 0.5%) of 0.3% of Si, 0.4% of Fe, 0.03% of Ti, 0.02% of Cu, 0.07% of Zn and 0.03% of other substances, or "Al-alloy 3003" (comparable with DIN Material No. 3.0515), i.e., composed of not less than 98.5% of Al, of the alloying constituents Mg, 0 to 0.3%, and Mn, 0.8 to 1.5%, and of the following permissible admixtures of 0.5% of Si, 0.5% of Fe, 0.2% of Ti, 0.2% of Zn, 0.1% of Cu and 0.15% of other substances.

Mechanical graining in stage I is carried out according to methods known in the art. In the process of the invention graining by means of a rotating brush roll made of wire is preferred. The particularly preferred method comprises graining by means of rotating nylon brushes, using an aqueous abrasive suspension.

Electrochemical graining in stage III can be conducted by any of the conventional methods using alternating current in an aqueous electrolyte containing HCl and/or HNO$_3$ or in a process using direct current, in which the web is made the anode. In addition the following process variants are, for example, possible in stage III and are incorporated herein by reference:

the graining of aluminum in a dilute aqueous HCl solution with an addition of further acids, for example, chromic acid or phosphoric acid, according to German Auslegeschrift No. 23 27 764 (equivalent to U.S. Pat. No. 3,887,447), or with an addition of corrosion inhibitors, for example amines, aldehydes, amides, urea or non-ionic surfactants, according to German Auslegeschrift No. 22 18 471, the graining of aluminum in a dilute aqueous HCl or HNO$_3$ solution using special types of electric current, for example an alternating current in which the current strength has an anode amplitude which is greater than the cathode amplitude, according to German Auslegeschrift No. 26 50 762 (equivalent to U.S. Pat. No. 4,087,341), the graining of aluminum in a dilute aqueous HCl or HNO$_3$ solution with an addition of boric acid or borates, according to German Auslegeschrift No. 21 49 899, the graining of aluminum in a neutral aqueous salt solution having a comparatively high salt concentration using alternating current or an anodic circuit arrangement, according to German Offenlegungsschrift No. 25 37 724, or the graining of aluminum in an acidic aqueous aluminum salt solution having a comparatively high salt concentration using alternating current or an anodic circuit arrangement, according to German Offenlegungsschrift No. 25 37 725.

The process parameters in the graining step, particularly in a continuous process, are generally within the following ranges: temperature of the electrolyte between about 20° and 60° C., concentration of active substance (acid, salt) between about 5 and 100 g/l (or even higher, in the case of salts), current density between about 15 and 130 A/dm$^2$, dwell time between about 10 and 100 seconds and flow rate of the electrolyte on the surface of the workpiece to be treated between about 5 and 100 cm/second. The type of current used is in most cases alternating current; it is, however, also possible to use modified current types, e.g., an alternating current with different amplitudes of current strength for the anode and cathode current.

In the subsequent process stage (V) the material is anodically oxidized in order to further improve, for example, the abrasion and adhesion properties of the surface of the support material. Conventional electrolytes, such as H$_2$SO$_4$, H$_3$PO$_4$, H$_2$C$_2$O$_4$, amidosulfonic acid, sulfosuccinic acid, sulfosalicylic acid or mixtures thereof, may be used for the anodic oxidation. By way of example, reference is made to the following standard methods for the use of aqueous electrolytes, containing H$_2$SO$_4$, for the anodic oxidation of aluminum (note, in this regard, e.g., M. Schenk, "Werkstoff Aluminium und seine anodische Oxydation", i.e., "The Material Aluminum and its Anodic Oxidation", Francke Verlag, Bern, 1948, page 760; "Praktische Galvanotechnik", i.e., "Practical Electroplating", Eugen G. Leuze Verlag, Saulgau, 1970, pages 395 et seq., and pages 518/519; and W. Huebner and C. T. Speiser, "Die Praxis der anodischen Oxidation des Aluminiums", i.e., "Practical Technology of the Anodic Oxidation of Aluminum", Aluminium Verlag, Duesseldorf, 1977, 3rd Edition, pages 137 et seq.):

The direct current sulfuric acid process, in which anodic oxidation is carried out in an aqueous electrolyte which conventionally contains approximately 230 g of H$_2$SO$_4$ per liter of solution, for about 10 to 60 minutes at about 10° to 22° C., and at a current density of about 0.5 to 2.5 A/dm$^2$. In this process, the sulfuric acid concentration in the aqueous electrolyte solution can also be reduced to about 8% to 10% by weight of H$_2$SO$_4$ (about 100 g of H$_2$SO$_4$ per liter), or it can be increased to about 30% by weight (365 g of H$_2$SO$_4$ per liter), or more.

The "hard-anodizing process" is carried out using an aqueous electrolyte, containing H$_2$SO$_4$ in a concentration of 166 g of H$_2$SO$_4$ per liter (or about 230 g of H$_2$SO$_4$ per liter), at an operating temperature of about 0° to 5° C., and at a current density of about 2 to 3 A/dm$^2$, for about 30 to 200 minutes, at a voltage which increases from approximately 25 to 30V at the beginning of the treatment, to approximately 40 to 100V toward the end of the treatment.

In addition to the processes for the anodic oxidation of support materials for printing plates, which have already been mentioned in the preceding paragraph, the following processes can, for example, also be used: the anodic oxidation of aluminum in an aqueous, H$_2$SO$_4$ containing electrolyte, in which the content of Al$^{3+}$ ions is adjusted to values exceeding 12 g/l (according to German Offenlegungsschrift No. 28 11 396, which is equivalent to U.S. Pat. No. 4,211,619), in an aqueous electrolyte containing H$_2$SO$_4$ and H$_3$PO$_4$ (according to German Offenlegungsschrift No. 27 07 810, which is equivalent to U.S. Pat. No. 4,049,504), or in an aqueous electrolyte containing H$_2$SO$_4$, H$_3$PO$_4$ and Al$^{3+}$ ions (according to German Offenlegungsschrift No. 28 36 803, which is equivalent to U.S. Pat. No. 4,229,266). The references disclosing these additional processes are incorporated herein by reference. Direct current is preferably used for the anodic oxidation, but it is also possible to use alternating current or a combination of these types of current (for example, direct current with superimposed alternating current). The layer weights of aluminum oxide range from about 1 to 10 g/$^2$, which correspond to thicknesses of the layers from about 0.3 to 3.0 μm.

The process of the invention which comprises stage V of an anodic oxidation of the aluminum support material for printing plates is optionally followed by one or more post-treating steps. Post-treating in an additional stage VI is particularly understood as a hydrophilizing chemical or electrochemical treatment of the aluminum oxide layer, for example, an immersion treatment of the material in an aqueous solution of polyvinyl phosphonic acid according to German Pat. No. 16 21 478 (equivalent to British Pat. No. 1,230,447), an immersion treatment in an aqueous solution of an alkali-metal silicate according to German Auslegeschrift No. 14 71 707 (equivalent to U.S. Pat. No. 3,181,461), or an electrochemical treatment (anodization) in an aqueous solution of an alkali metal silicate according to German Offenlegungsschrift No. 25 32 769 (equivalent to U.S. Pat. No. 3,902,976), all of which are incorporated herein by reference. These post-treatment steps serve, in particular, to improve even further the hydrophilic properties of the aluminum oxide layer, which are already sufficient for many fields of application, with the other well-known properties of the layer being at least maintained.

The material which, according to the invention, has been mechanically grained in stage I, electrochemically grained in stage III, cathodically modified and stages II and/or IV, anodically oxidized in stage V and subjected to a hydrophilizing post-treatment in stage VI, is used in manufacturing printing plates which carry radiation-sensitive coatings. For this purpose, the support material is coated with a radiation-sensitive composition, either at the manufacturer of presensitized printing plates or, in the process of coating a support material, by the user. Suitable photosensitive layers basically are any layers which, after irradiation (exposure), optionally followed by development and/or fixing, yield a surface in image configuration, which can be used for printing. In addition to the layers which contain silver halides, and which are used in many fields, various other layers are also known, such as are described, for example, in "Light-Sensitive Systems", by Jaromir Kosar, published by John Wiley & Sons, New York, 1965: the colloid layers containing chromates and dichromates (Kosar, Chapter 2); the layers containing unsaturated compounds, in which, upon exposure, these compounds are isomerized, rearranged, cyclized, or cross-linked (Kosar, Chapter 4); the layers containing compounds which can be photopolymerized, in which, on being exposed, monomers or prepolymers undergo polymerization, optionally with the aid of an initiator (Kosar, Chapter 5); and the layers containing o-diazoquinones, such as naphthoquinone-diazides, p-diazoquinones, or condensation products of diazonium salts (Kosar, Chapter 7). The layers which are suitable also include the electrophotographic layers, i.e., those which contain an inorganic or organic photoconductor. In addition to the photosensitive substances, these layers can, of course, also contain other constituents, such as for example, resins, dyes or plasticizers. In particular, the following photosensitive compositions or compounds can be employed in the coating of support materials prepared according to the process of the present invention:

positive-working o-quinone diazide compounds, preferably o-naphthoquinone diazide compounds, which are described, for example, in German Pat. Nos. 854,890, 865,109, 879,203, 894,959, 938,233, 11 09 521, 11 44 705, 11 18 606, 11 20 273 and 11 24 817;

negative-working condensation products from aromatic diazonium salts and compounds with active carbonyl groups, preferably condensation products formed from diphenylaminediazonium salts and formaldehyde, which are described, for example, in German Pat. Nos. 596,731, 11 38 399, 11 38 400, 11 38 401, 11 42 871, and 11 54 123; U.S. Pat. Nos. 2,679,498 and 3,050,502 and British Pat. No. 712,606;

negative-working co-condensation products of aromatic diazonium compounds, for example, according to German Offenlegungsschrift No. 20 24 244;

positive-working layers according to German Offenlegungsschrift No. 26 10 842, German Pat. No. 27 18 254 or German Offenlegungsschrift No. 29 28 636 which contain a compound which, on being irradiated, splits off an acid, a monomeric or polymeric compound which possesses at least one C—O—C group, which can be split off by acid (e.g., an orthocarboxylic acid ester group, or a carboxamide-acetal group), and, if appropriate, a binder;

negative-working layers, composed of photopolymerizable monomers, photo-initiators, binders and, if appropriate, further additives. In these layers for example, acrylic and methacrylic acid esters, or reaction products of diisocyanates with partial esters of polyhydric alcohols are employed as monomers, as described, for example, in U.S. Pat. Nos. 2,760,863 and 3,060,023, and in German Offenlegungsschriften Nos. 20 64 079 and 23 61 041;

negative-working layers according to German Offenlegungsschrift No. 30 36 077, which contain, as the photosensitive compound, a diazonium salt polycondensation product, or an organic azido compound, and which contain, as the binder, a high-molecular weight polymer with alkenylsulfonylurethane or cycloalkenylsulfonylurethane side groups.

It is also possible to apply photo-semiconducting layers to the support materials prepared according to the invention, such as described, for example, in German Pat. Nos. 11 17 391, 15 22 497, 15 72 312, 23 22 046 and 23 22 047, as a result of which highly photosensitive electrophotographically-working printing plates are produced.

In the examples which follow, percentages are related to weight; parts by weight are related to parts by volume as the kilogram is related to the liter. In the evaluation of the support materials prepared according to the process of the invention, the following standard methods are used:

Determination of the Consumption of Dampening Solution

The amount of dampening solution applied is determined with the aid of an indicating device used in a dampening unit manufactured by Dahlgren. This indicating device does not provide an absolute measure of the consumption of dampening solution, however, the readings in scale units supplied by this device for various printing sequences can be compared with one another (relative measures).

Determination of the Resistance to Abrasion

In order to define the abrasion behavior, printing forms manufactured from support materials which have been cathodically modified according to the process of the invention, are used for printing on a printing machine together with printing forms manufactured from support materials which have been grained and anodized in a corresponding manner, without the application of this modifying step. The two types of plates are compared at particular intervals, with respect to adhesion of the layer and bright spots (indicating abrasion) in the non-image areas.

Determination of the Electrochemical Removal of Material

The removal of material from the aluminum support resulting from cathodic modification, is determined by a gravimetric method. For this purpose grained aluminum sheets, 100×100 mm in size, are weighed prior to the cathodic treatment. After carrying out the treatment of the invention, the samples are rinsed and dried and the removal of material is determined by re-weighing.

Determination of the Peak-to-Valley Height

The peak-to-valley height is determined according to DIN 4768, in the version dated October 1970, the peak-to-valley height $R_z$ is then the arithmetic mean calculated from the individual peak-to-valley height values of five mutually adjacent individual measurement lengths.

The individual peak-to-valley height is defined as the distance of two parallel lines, which contact the highest and lowest points of the roughness profile within the individual measurement lengths, from the median line. The individual measurement length corresponds to one fifth of the length, projected at right angles onto the median line, of that part of the roughness profile, which is directly used for evaluation. The median line is the line which runs parallel to the general direction of the roughness profile having the shape of the geometrically ideal profile and which divides the roughness profile in such a way that the sum of the areas filled with material above it and the sum of the areas free from material below it are equal.

The invention will now be illustrated by means of selected, preferred examples, without being limited to these examples.

EXAMPLES 1 TO 43

In the examples which follow, the process of the invention, unless explicitly indicated otherwise, is invariably carried out under the following conditions in stages I, III, V and VI to demonstrate the specific effects of the cathodic modification in stages II and IV:

Stage I: Wire Brushing (WB) with a resulting peak-to-valley height $R_z$ of 5.0 μm in the rolling direction and 6.6 μm transversely to the rolling direction;

Slurry Brushing (SB) with a resulting peak-to-valley height $R_z$ of 5.4 μm in the rolling direction and 5.7 μm transversely to the rolling direction;

Sandblasting (S) with a resulting peak-to-valley height $R_z$ of 7.9 μm in the rolling direction and 8.1 μm transversely to the rolling direction.

Stage III: In all examples electrochemical graining is conducted in an aqueous solution containing 20 g/l of $HNO_3$ and 50 g/l of $Al(NO_3)_3 \cdot 9 H_2O$ at a temperature of 40° to 45° C. under the action of an alternating current having a current density of 20 A/dm² for a period of 10 seconds and with intense circulation of the bath.

Stage V: In all examples the anodizing process is run in an aqueous electrolyte containing sulfuric acid, according to the conditions described in German Offenlegungsschrift No. 28 11 396. The oxide layer weight is 3.0 g/m².

Stage VI: In all examples the preferred hydrophilizing post-treatment of the anodized material is conducted in an aqueous solution of polyvinyl phosphonic acid in a concentration of 5 g/l at a temperature of 50° C. and a time of action of 20 seconds.

In all process variants carried out in the examples each treatment stage is followed by rinsing the surface with demineralized water.

The operating temperature used in stages II and IV is invariably 30° to 35° C.

TABLE I

Cathodic Intermediate Treatment Following Mechanical Graining (Stage I)

| Example | Electrolyte | Concent. (g/l) | pH | Voltage (V) | Current Density (A/dm²) | Time (sec) | Mech. Graining | Removal of Material (g/m²) |
|---|---|---|---|---|---|---|---|---|
| 1 | NaNO₃ | 5 | 6.4 | 40 | 5 | 90 | WB | 0.50 |
| 2 | NaNO₃ | 10 | 6.6 | 60 | 17 | 30 | SB | 1.27 |
| 3 | NaNO₃ | 20 | 6.8 | 25 | 10 | 60 | WB | 1.18 |
| 4 | NaNO₃ | 50 | 6.9 | 30 | 38 | 20 | SB | 1.69 |
| 5 | NaNO₃ | 50 | 6.9 | 50 | 80 | 10 | WB | 2.88 |
| 6 | NaNO₃ | 100 | 7.3 | 40 | 65 | 20 | SB | 3.96 |
| 7 | NaNO₃ | 250 | 8.2 | 20 | 45 | 30 | WB | 4.10 |
| 8 | NaNO₃/HNO₃ | 20/5 | 1.2 | 10 | 12 | 30 | SB | 1.66 |
| 9 | NaNO₃/HNO₃ | 50/10 | 0.9 | 10 | 41 | 30 | SB | 4.12 |
| 10 | NaCl | 5 | 6.3 | 50 | 11 | 30 | SB | 0.44 |
| 11 | NaCl | 10 | 6.9 | 40 | 16 | 30 | WB | 0.75 |
| 12 | NaCl | 20 | 7.2 | 25 | 19 | 30 | SB | 1.32 |
| 13 | NaCl | 20 | 7.2 | 30 | 24 | 30 | WB | 1.68 |
| 14 | NaCl | 20 | 7.2 | 50 | 48 | 30 | SB | 4.25 |
| 15 | NaCl | 50 | 7.6 | 40 | 68 | 30 | S | 5.97 |
| 16 | NaCl | 100 | 8.1 | 30 | 70 | 30 | SB | 6.26 |
| 17 | NaCl | 250 | 8.5 | 20 | 80 | 30 | S | 7.43 |
| 18 | NaCl/HCl | 50/10 | 0.5 | 10 | 45 | 30 | SB | 4.32 |
| 19 | NaCl/HCl | 50/5 | 0.9 | 10 | 13 | 30 | SB | 1.79 |
| 20 | NaClO₃ | 50 | 7.4 | 30 | 20 | 30 | SB | 1.28 |
| 21 | NaHSO₄ | 50 | 6.5 | 20 | 16 | 30 | SB | 0.91 |
| 22 | NaH₂PO₄ | 50 | 7.6 | 20 | 10 | 30 | SB | 0.62 |
| 23 | Na₂B₄O₇ | 50 | 9.3 | 50 | 15 | 30 | SB | 0.64 |
| 24 | NaBF₄ | 50 | 3.8 | 30 | 22 | 30 | SB | 2.43 |
| 25 | NaSiF₄ | 20 | 3.5 | 40 | 8 | 60 | SB | 0.75 |

TABLE II

Cathodic Modification Following Electrochemical Graining (Stage III)

| Example | Electrolyte | Concentrat. (g/l) | pH | Voltage (V) | Current Density (A/dm²) | Time (sec) | Removal of Material (g/m²) |
|---|---|---|---|---|---|---|---|
| 26 | NaNO₃ | 5 | 6.4 | 60 | 9 | 60 | 0.87 |
| 27 | NaNO₃ | 10 | 6.6 | 60 | 17 | 30 | 1.32 |
| 28 | NaNO₃ | 20 | 6.8 | 25 | 10 | 60 | 1.35 |
| 29 | NaNO₃ | 20 | 6.8 | 40 | 18 | 30 | 1.28 |
| 30 | NaNO₃ | 50 | 6.9 | 30 | 38 | 20 | 1.85 |
| 31 | NaNO₃ | 50 | 6.9 | 50 | 80 | 10 | 2.89 |
| 32 | NaNO₃ | 100 | 7.3 | 30 | 45 | 20 | 2.51 |
| 33 | NaNO₃ | 100 | 7.3 | 40 | 65 | 20 | 3.87 |
| 34 | NaNO₃ | 250 | 8.2 | 15 | 30 | 20 | 1.26 |
| 35 | NaCl | 250 | 8.2 | 20 | 45 | 30 | 4.22 |
| 36 | NaCl | 10 | 6.9 | 40 | 16 | 30 | 0.83 |
| 37 | NaCl | 20 | 7.2 | 25 | 19 | 30 | 1.42 |
| 38 | NaCl | 20 | 7.2 | 50 | 48 | 30 | 4.36 |
| 39 | NaCl | 50 | 7.6 | 20 | 25 | 30 | 1.18 |
| 40 | NaCl | 50 | 7.6 | 50 | 100 | 10 | 3.85 |
| 41 | NaCl | 100 | 8.1 | 15 | 30 | 30 | 1.93 |
| 42 | NaCl | 100 | 8.1 | 20 | 44 | 30 | 3.74 |
| 43 | NaCl | 250 | 8.5 | 20 | 80 | 10 | 3.11 |

EXAMPLE 44

An aluminum sheet which has been subjected to intermediate treatments according to Example 6 in stage II and according to Example 33 in stage IV is coated with the following solution:
6.00 parts by weight of a cresol/formaldehyde novolak (with softening range of 105 to 120° C., according to DIN 53 181),
1.10 parts by weight of 4-(2-phenyl-prop-2-yl)-phenyl-1,2-naphthoquinone-2-diazide- 4-sulfonate,
0.81 part by weight of polyvinyl butyral,
0.75 part by weight of 1,2-naphthoquinone-2-diazide-4-sulfochloride,
0.08 part by weight of crystal violet, and
91.36 parts by weight of a solvent mixture composed of 4 parts by volume of ethylene glycol monomethyl ether, 5 parts by volume of tetrahydrofuran, and 1 part by volume of butyl acetate.

The weight of the radiation-sensitive layer applied to the support is about 3 g/m$^2$. The plate is exposed under an original using a 5 kW metal halide lamp and is developed with the following solution:
5.3 parts by weight of sodium metasilicate.9 H$_2$O,
3.4 parts by weight of trisodium phosphate.12 H$_2$O,
0.3 part by weight of sodium dihydrogen phosphate (anhydrous), and
91.0 parts by weight of water.

The printing form thus manufactured can be used for printing more than 150,000 good-quality copies. It has an excellent printing behavior. Even if dampening solution is sparingly supplied, the plate does not tend to accept ink in the non-image areas ("scumming"). The consumption of dampening solution of the printing form is reduced by about 10% to 15%, as against a comparative printing form the support material of which is not subjected to cathodic treatment between stage III and stage V, but which is, otherwise, of identical construction. In both printing forms, the reproduction layers are still in good condition, however, the foil used as a comparison shows bright spots in the non-image areas after printing about 90,000 to 110,000 copies, which indicates mechanical abrasion. As compared to this, the plate manufactured according to the invention does not show any signs of wear of the support material, even after printing 150,000 copies.

EXAMPLE 45

An aluminum support material which has been subjected to intermediate treatments according to Example 19 in stage II and according to Example 42 in stage IV is coated with the following solution:
0.70 part by weight of the polycondensation product of 1 mole of 3-methoxy-diphenylamine-4-diazonium sulfate and 1 mole of 4,4'-bis-methoxymethyl-diphenyl ether, precipitated as the mesitylene sulfonate,
3.40 parts by weight of 85% strength H$_3$PO$_4$, 3.00 parts by weight of a modified epoxide resin, obtained by reacting 50 parts by weight of an epoxide resin having a molecular weight of less than 1,000 and 12.8 parts by weight of benzoic acid in ethylene glycol monomethyl ether, in the presence of benzyltrimethylammonium hydroxide,
0.44 part by weight of finely-ground Heliogen Blue G (C.I. 74 100),
62.00 parts by volume of ethylene glycol monomethyl ether,
30.60 parts by volume of tetrahydrofuran, and
8.00 parts by volume of butyl acetate.

After exposure through an original, development is carried out with a solution of
2.80 parts by weight of Na$_2$SO$_4$.10H$_2$O,
2.80 parts by weight of MgSO$_4$.7H$_2$O,
0.90 part by weight of 85% strength H$_3$PO$_4$,
0.08 part by weight of H$_3$PO$_3$,
1.60 parts by weight of a non-ionic surfactant,
10.00 parts by weight of benzyl alcohol,
20.00 parts by weight of n-propanol, and
60.00 parts by weight of water.

The printing form thus prepared yields more than 150,000 good-quality prints on a sheet-fed offset press and does not show any signs of mechanical damage of the support surface in the non-image areas, even after the layer has worn down.

Compared with a printing form the support material of which has been prepared without the intermediate treatment in stage IV, the support material subjected to an intermediate treatment according to Example 42 consumes 25% less dampening solution.

A support material which has been produced without the intermediate treatments according to the invention carried out in stages II and IV shows a dark grey, streaky surface and is thus unsuitable for practical application.

What is claimed is:

1. A process for the manufacture of grained support materials of aluminum or an aluminum alloy for use in lithographic printing plates comprising the steps of:
   (I) mechanically graining the material;
   (II) treating the material;
   (III) electrochemically graining the material in an acid-containing electrolyte
   (IV) treating the material; and
   (V) anodically oxidizing the material; wherein at least one of the treating steps II and IV comprise cathodic modification of the aluminum support material in a solution of aqueous electrolyte comprising at least one member selected from the group consisting of a water-soluble salt in a concentration from 3 g/l up to the saturation limit and an acid in a concentration from 0.5 to 50 g/l, said cathodic modification comprising the steps of:
   making the grained support the cathode;
   adjusting the pH of the aqueous electrolyte to a value ranging from 0 to 11; and
   applying direct current from 30 to 100 A/dm$^2$ for from 5 to 90 seconds at a temperature ranging from 15° to 90° C. to remove from 0.1 to 10 g/m$^2$ of material.

2. A process according to claim 1 wherein the pH of the aqueous electrolyte is in the range from 1 to 11.

3. A process according to claim 1 wherein the pH of the aqueous electrolyte is in the range from 3 to 9.

4. A process according to claim 1 wherein the pH of the aqueous electrolyte is in the range from 1 to 5.

5. A process according to claim 1 wherein the pH of the aqueous electrolyte is approximately neutral.

6. A process according to claim 1 wherein a direct current of from about 10 to 80 A/dm$^2$ is applied.

7. A process according to claim 1 wherein from 0.5 to 5 g/m$^2$ of material are removed during the second electrochemical treating step.

8. A process according to claim 1 wherein the mechanical graining step comprises wire brushing and from 1 to 10 g/m$^2$ of material are removed during the first electrochemical treating step.

9. A process according to claim 1 wherein the mechanical graining step comprises slurry brushing and from 0.5 to 3 g/m² of material are removed during the first electrochemical treating step.

10. A process according to claim 1 wherein the mechanical graining step comprises sandblasting and from 6 to 10 g/m² of material are removed during the first electrochemical treating step.

11. A process according to claim 1 wherein the electrolyte comprises an acid in a concentration from 0.5 to 50 g/l.

12. A process according to claim 1 wherein the water-soluble salt is present in a concentration of 0.5 to 50 g/l.

13. A process according to claim 1 wherein the acid is present in a concentration of 1 to 20 g/l.

14. A process according to claim 6 wherein the temperature during the electrochemical treatment steps is from 20° to 40° C.

15. A process according to claim 14 wherein the duration of the direct current is from 10 to 60 seconds.

16. A process according to claim 1 wherein the electrochemical graining step comprises alternating current in an aqueous electrolyte comprising hydrochloric acid or nitric acid.

17. A process according to claim 1 wherein the electrochemical graining step comprises direct current in an aqueous electrolyte comprising nitric acid.

18. A process according to claim 1 wherein the anodic oxidation step comprises direct current in an aqueous electrolyte comprising sulfuric acid or phosphoric acid or a mixture thereof.

19. A process according to claim 1 further comprising the step of hydrophilizing the material.

20. A printing plate produced by the process of claim 1.

21. A printing plate according to claim 20 further comprising a radiation-sensitive layer.

22. A process according to claim 1 wherein at least one of steps II and IV comprises a chemical treatment in acidic or alkaline medium.

23. A process according to claim 22 wherein step II comprises a chemical treatment in acidic or alkaline medium.

24. A process according to claim 1, wherein both of steps II and IV comprise the recited cathodic modification of the aluminum support material.

* * * * *